United States Patent
Hong

(10) Patent No.: US 6,732,062 B2
(45) Date of Patent: May 4, 2004

(54) APPARATUS FOR ANALYZING A FAILURE OF A SEMICONDUCTOR DEVICE AND METHOD THEREOF

(75) Inventor: Ki Won Hong, Seoul (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 10/429,823

(22) Filed: May 6, 2003

(65) Prior Publication Data

US 2003/0208337 A1 Nov. 6, 2003

(30) Foreign Application Priority Data

May 6, 2002 (KR) .................... 10-2002-24701

(51) Int. Cl.⁷ .................. G06F 11/30; G06F 19/00; G06F 15/00
(52) U.S. Cl. .................. 702/183; 700/121; 716/4
(58) Field of Search .................. 702/84, 182, 183, 702/184, 185; 438/15; 324/765; 700/121; 714/718, 723, 738; 716/4

(56) References Cited

U.S. PATENT DOCUMENTS 5,946,214 A * 8/1999 Heavlin et al. .......... 700/121
6,477,685 B1 * 11/2002 Lovelace .......... 716/4

* cited by examiner

*Primary Examiner*—John Barlow
*Assistant Examiner*—John Le
(74) *Attorney, Agent, or Firm*—Jacobson Holman PLLC

(57) ABSTRACT

In an apparatus for analyzing a failure of a semiconductor device, a wafer map memory stores test result data of each test wafer. A failure die number/rate, a D/S good die number/yield and a FBM good die number/yield on each test mode of each test wafer are calculated. In case a failure bit mode to be defined is selected from a plurality of failure bit modes, a failure die rate for total dies and a failure die rate for total failure dies are calculated. An expected FBM yield, an expected D/S yield, an average D/S yield, and a maximum/minimum yield are calculated. The calculated values are displayed on a monitor.

4 Claims, 8 Drawing Sheets

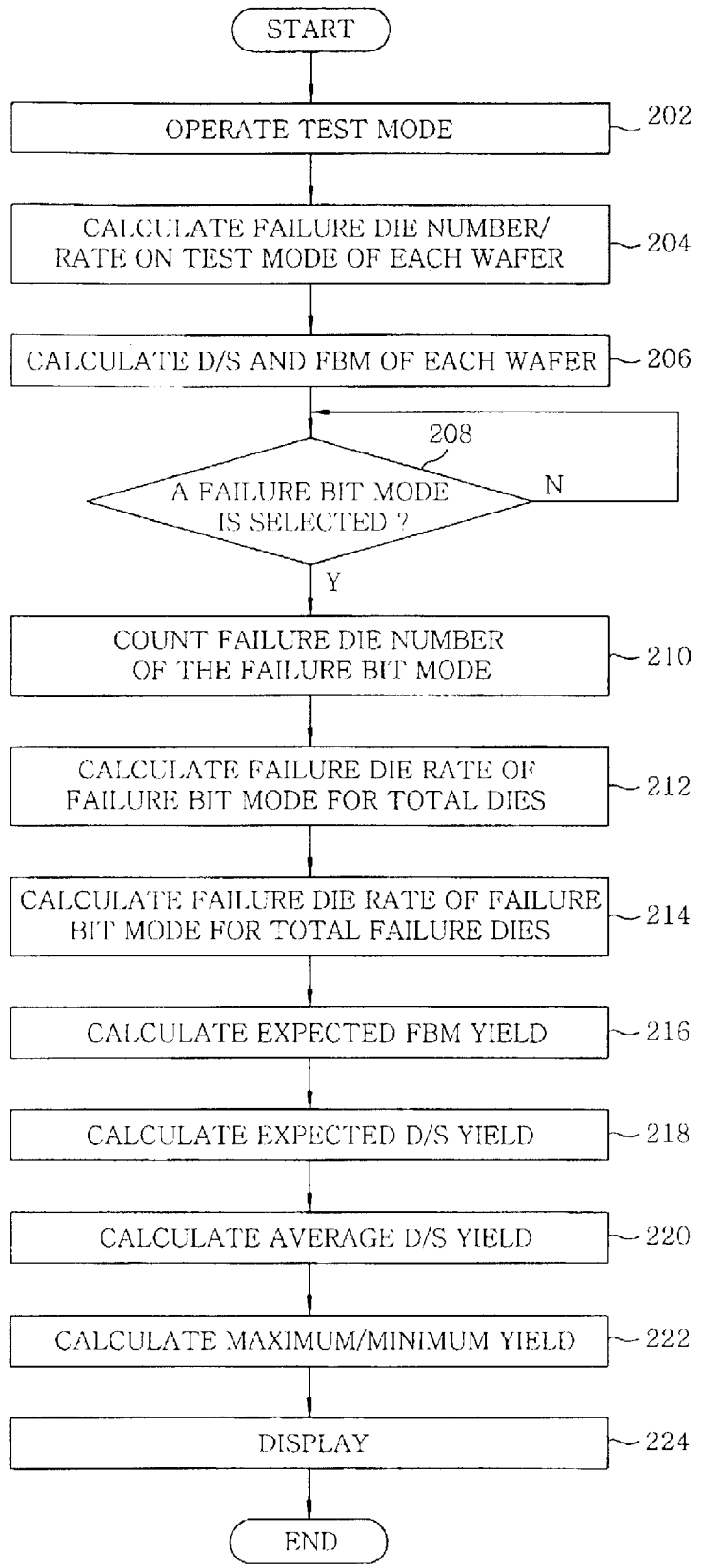

FIG. 3

| WF No | Good [ea] | YLD [%] | O/S QTY | O/S Rate | Func QTY | Func Rate | DC QTY | DC Rate | IDD QTY | IDD Rate | FBM Good | FBM YLD |
|---|---|---|---|---|---|---|---|---|---|---|---|---|
| 1 | 30 | 62.5 | 1 | 2.1 | 17 | 35.4 | 0 | 0.0 | 0 | 0.0 | 31 | 64.6 |
| 2 | 30 | 62.5 | 0 | 0.0 | 18 | 37.5 | 0 | 0.0 | 0 | 0.0 | 30 | 62.5 |
| 3 | 34 | 70.8 | 1 | 2.1 | 12 | 25.0 | 0 | 0.0 | 1 | 2.1 | 35 | 72.9 |
| 4 | 35 | 72.9 | 0 | 0.0 | 12 | 25.0 | 0 | 0.0 | 1 | 2.1 | 38 | 79.2 |
| 5 | 27 | 56.2 | 1 | 2.1 | 20 | 41.7 | 0 | 0.0 | 0 | 0.0 | 28 | 58.3 |
| 6 | 35 | 72.9 | 1 | 2.1 | 11 | 22.9 | 0 | 0.0 | 1 | 2.1 | 36 | 75.0 |
| 6 | 191 | 66.3 | 4 | 1.4 | 90 | 31.3 | 0 | 0.0 | 3 | 1.0 | 198 | 68.8 |

FIG. 4

Select
Fail : BIT2COL_E

| Wafer ID | Only Select Fail Class | | | | | Select Fail Class & other | | | | | | Not Select Fail Class | | | | | DS Yield | FBM Yield |
|---|---|---|---|---|---|---|---|---|---|---|---|---|---|---|---|---|---|---|
| | A1 | B1 | C1 | D1 | E1 | A2 | B2 | C2 | D2 | E2 | | A3 | B3 | C3 | D3 | E3 | | |
| TCX041-01 | 13 | 27.1 | 59.1 | 81.3 | 79.2 | 10 | 20.8 | 45.5 | 75 | 79.2 | | 9 | 18.8 | 40.9 | 73 | 70.9 | 50 | 54.2 |
| TCX041-02 | 30 | 62.5 | 83.3 | 87.5 | 85.4 | 30 | 62.5 | 83.3 | 87.5 | 85.4 | | 6 | 12.5 | 16.7 | 37.5 | 35.4 | 25 | 25 |
| AVG(D#)-Xy | 82.3 | | | | | 79.2 | | | | | | 53.1 | | | | | 37.5 | 39.6 |

Best Yield Up :: 84.40    Worst Yield Up :: 77.08

FIG.5

| Lot No. | WF No. | Good [ea] | YLD [%] | O/S QTY | O/S Rate[%] | Func QTY | Func Rate[%] | DC QTY | DC Rate[%] | DD QTY | DD Rate[%] | FBM QTY | FBM Rate[%] |
|---|---|---|---|---|---|---|---|---|---|---|---|---|---|
| TCX0191 | 2 | 33 | 68.8 | 0 | 0 | 14 | 29.2 | 0 | 0.0 | 1 | 2.1 | 35 | 72.9 |
| | 3 | 31 | 64.6 | 0 | 0 | 17 | 35.4 | 0 | 0.0 | 0 | 0 | 32 | 66.6 |
| | 4 | 35 | 72.9 | 0 | 0 | 13 | 27.1 | 0 | 0.0 | 0 | 0 | 35 | 72.9 |
| | 5 | 19 | 39.6 | 0 | 0 | 27 | 56.2 | 0 | 0.0 | 2 | 4.2 | 22 | 45.8 |
| | 7 | 30 | 62.5 | 0 | 0 | 18 | 37.5 | 0 | 0.0 | 0 | 0 | 32 | 66.6 |
| | 9 | 28 | 58.3 | 0 | 0 | 19 | 39.6 | 0 | 0.0 | 1 | 2.1 | 30 | 62.5 |
| | 10 | 21 | 43.8 | 1 | 2.1 | 26 | 54.2 | 0 | 0.0 | 0 | 0 | 23 | 47.9 |
| Total | 7 | 197 | 58.6 | 1 | 0.3 | 134 | 39.9 | 0 | 0.0 | 4 | 1.2 | 209 | 62.2 | ered considerable time is required to discover the main failure from the test result. Especially, in case the handling process is used for the calculation, the calculation is not possible because of various overlaps between the failure bit modes. Consequently, the main failure should be experientially checked in the conventional method and errors may occur in checking the main failure, too.

APPARATUS FOR ANALYZING A FAILURE OF A SEMICONDUCTOR DEVICE AND METHOD THEREOF

FIELD OF THE INVENTION

The present invention relates to apparatus for analyzing of a semiconductor device; and, more particularly, to an apparatus and a method for analyzing a failure of a semiconductor device on a failure mode basis.

BACKGROUND OF THE INVENTION

As well known, a development of a manufacturing technology of a semiconductor device accelerates a refinement and a high integration of the semiconductor device, and thus, the process or design margin of a manufacturing is decreased. A failure of the semiconductor device is caused by non-uniformity in a wafer such as an error of a mask alignment, an impurity concentration and a thickness of a thin film, or by a minute defect of the wafer. Accordingly, it is required to investigate the causes of the failure of the semiconductor device and improve manufacturing processes of the semiconductor device, so that the production yield can be increased.

A conventional method checks a failure of a semiconductor device on a bit mode of each test mode (i.e., O/S, Function, DC, IDD and the like) by carrying a test device (or a monitor device) such as SRAM into a line at a certain interval (e.g., two weeks), wherein O/S, Function, DC and IDD indicate an open/short test, a signal (pattern) input test, a DC characteristic value test and an electric current characteristic test, respectively.

Such conventional method for analyzing the failure of the semiconductor device automatically calculates a failure die number/rate, a failure bit map (FBM) number/rate, and a good die number/yield on a test mode of a test wafer, as illustrated in FIG. 5. Herein, FBM represents a rate for a result obtained by checking cell operations of a test device.

Further, the conventional method provides graphs for showing a failure bit mode rate and a failure bit mode number on a failure bit mode of each wafer, as illustrated in FIGS. 6A and 6B, respectively. Types of the failure bit mode are represented in right sections of FIGS. 6A and 6B.

In other words, the conventional method analyzes and provides information on the failure die number/rate on a test mode, the failure die number/rate on a failure bit mode, the FBM yield, and the die/sorting (D/S) yield.

Meanwhile, when the failure of the semiconductor device is analyzed, it is significant to quickly discover a main cause of failure on the test mode in order to improve the production yield of the semiconductor device. If the failure analysis is focused on the special cause, it is possible to decrease time to achieve a goal of the production yield.

Accordingly, it is required to provide comparison information on each failure bit mode in consideration of an overlap of failure bit modes on the assumption that one die is composed of many units, for example, 128 units. However, said conventional method does not provide such information.

In the conventional method, one die is selected from a test wafer map in order to discover a main failure on a failure bit map and a failure bit mode and check an overlap between the failure bit modes.

Since the main failure is experientially checked or calculated by a handling process in the conventional method,

SUMMARY OF THE INVENTION

To solve the problems described above, an embodiment of the present invention provides an apparatus and a method for analyzing a failure of a semiconductor device, which is capable of simply discovering a main failure factor on a failure bit mode basis on a test mode of each wafer.

To solve the problems described above, another embodiment of the present invention provides an apparatus for analyzing a failure of a semiconductor device, which calculates a failure die number/rate, a FBM yield and a D/S yield on a test mode of each test wafer, the apparatus including: a wafer map memory for storing test result data of each test wafer; a means for calculating a failure die number/rate, a D/S good die number/yield and a FBM good die number/yield on the test mode of each test wafer; a means for storing the calculated values; a means for calculating, in case a failure bit mode to be defined is selected from a plurality of failure bit modes, a failure die rate for total dies and a failure die rate for total failure dies based on a total die number and a failure die number of the selected failure bit mode; a means for calculating an expected FBM yield based on the FBM yield and the failure die rate for the total dies and calculating an expected D/S yield based on the expected FBM yield, the FBM yield and the D/S yield; a means for calculating an average D/S yield of the selected failure bit mode based on the expected FBM yield, the FBM yield and the D/S yield of the selected test wafer; a means for calculating a maximum/minimum yield based on the expected FBM yield, and a minimum and a maximum deviation value between the FBM yield and the D/S yield; and a means for displaying the calculated values on a monitor.

To solve the problems described above, still another embodiment of the present invention provides a method for analyzing a failure of a semiconductor device, which calculates a failure die number/rate, a FBM yield and a D/S yield on a test mode of each test wafer, the method including the steps of: (a) calculating a failure die number/rate, a D/S good die number/yield and a FBM good die number/yield on the test mode of each test wafer; (b) waiting for a user to select a failure bit mode to be defined from a plurality of failure bit modes; (c) selecting a certain failure bit mode as a failure bit mode to be defined, and calculating a failure die rate for total dies and a failure die rate for total failure dies based on a total die number and a failure die number of the selected failure bit mode; (d) calculating an expected FBM yield based on the FBM yield and the failure die rate for the total dies; (e) calculating an expected D/S yield based on the expected FBM yield, the FBM yield and the D/S yield; (f) calculating an average D/S yield of the selected failure bit mode based on the expected FBM yield, the FBM yield, and the D/S yield of the selected test wafer; (g) calculating a maximum and a minimum yield based on the expected FBM yield, and a maximum and a minimum deviation value between the FBM yield and the D/S yield; (h) displaying the calculated values on a monitor; and (i) iteratively performing the steps (c) to (h) whenever a new failure bit mode is selected as a failure bit mode to be defined.

BRIEF DESCRIPTION OF THE DRAWINGS

FIG. 2 illustrates a flow chart for describing a process for performing a failure analysis of the semiconductor device in accordance with the present invention;

FIG. 3 depicts a table for showing a failure die number/rate, a FBM good die number/yield, and a D/S good die number/yield on a test mode of each test wafer in case the failure analysis is performed in accordance with the present invention;

FIG. 4 provides a table for presenting result values of a simulation in case BIT3COL_E is selected as a failure mode to be defined;

FIG. 5 presents a table for showing a failure die number/rate, a FBM good die number/yield, and a D/S good die number/yield on a test mode of each test wafer in case the failure analysis is performed in accordance with a conventional method;

DESCRIPTION OF THE PREFERRED EMBODIMENTS

The preferred embodiments of the present invention will be described in detail with reference to the accompanying drawings.

In a conventional method, an overlap relation on a failure bit mode basis is checked by an observation using a masking, and a main bit failure is experientially discovered based on the observation result.

In the present invention, however, a certain failure bit mode is selected from a plurality of failure bit modes as a target failure bit mode to be defined. Then, an expected FBM yield, an expected D/S yield, an average D/S yield and a maximum/minimum yield are automatically calculated, so that the main failure factor can be simply and easily discovered from various types of the failure bit modes, wherein the expected FBM yield and the expected D/S yield are calculated based on a failure die rate of the selected failure bit mode for total dies and a failure die rate of the selected failure bit mode for total failure dies.

Figure 1A:
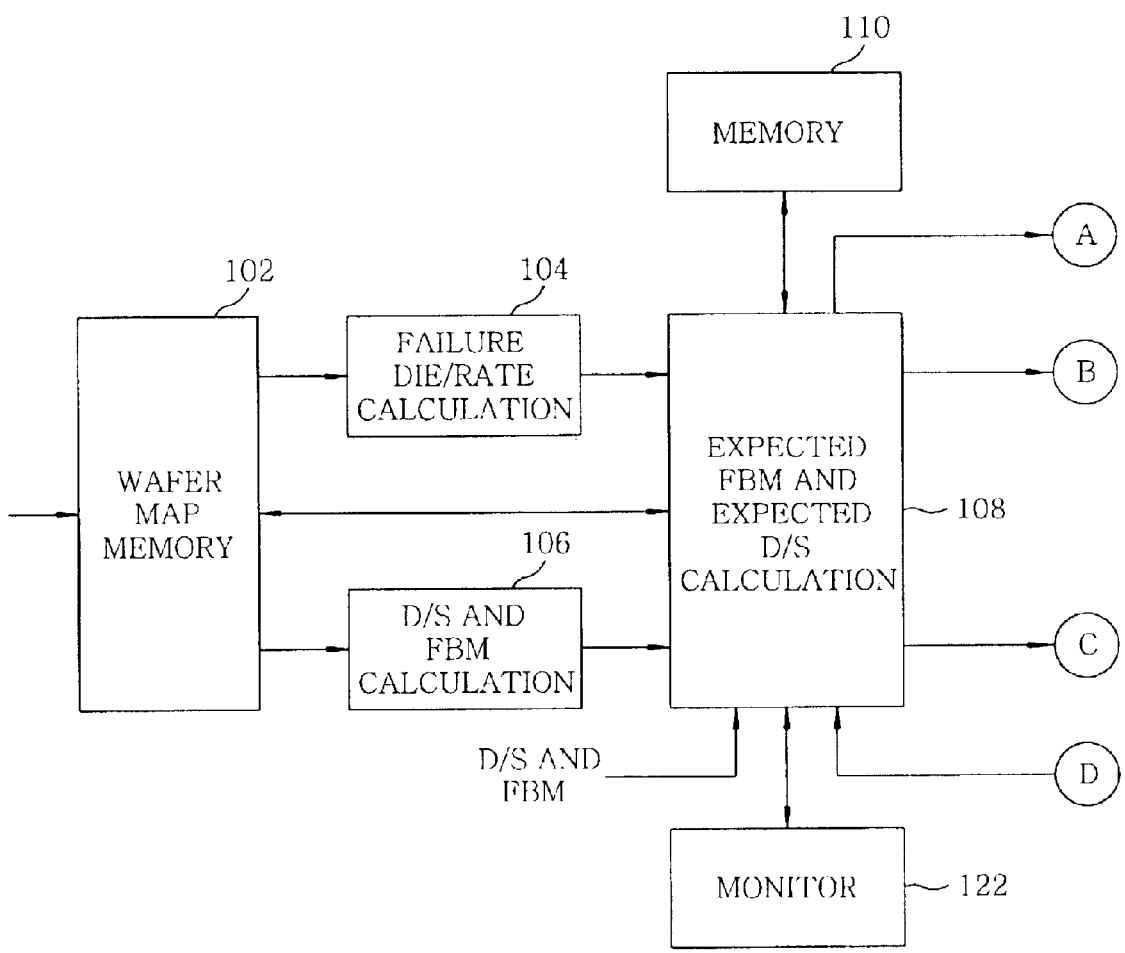
FIG. 1 shows a block diagram of an apparatus for analyzing a failure of a semiconductor device in accordance a preferred embodiment of the present invention.
Figure 1B:
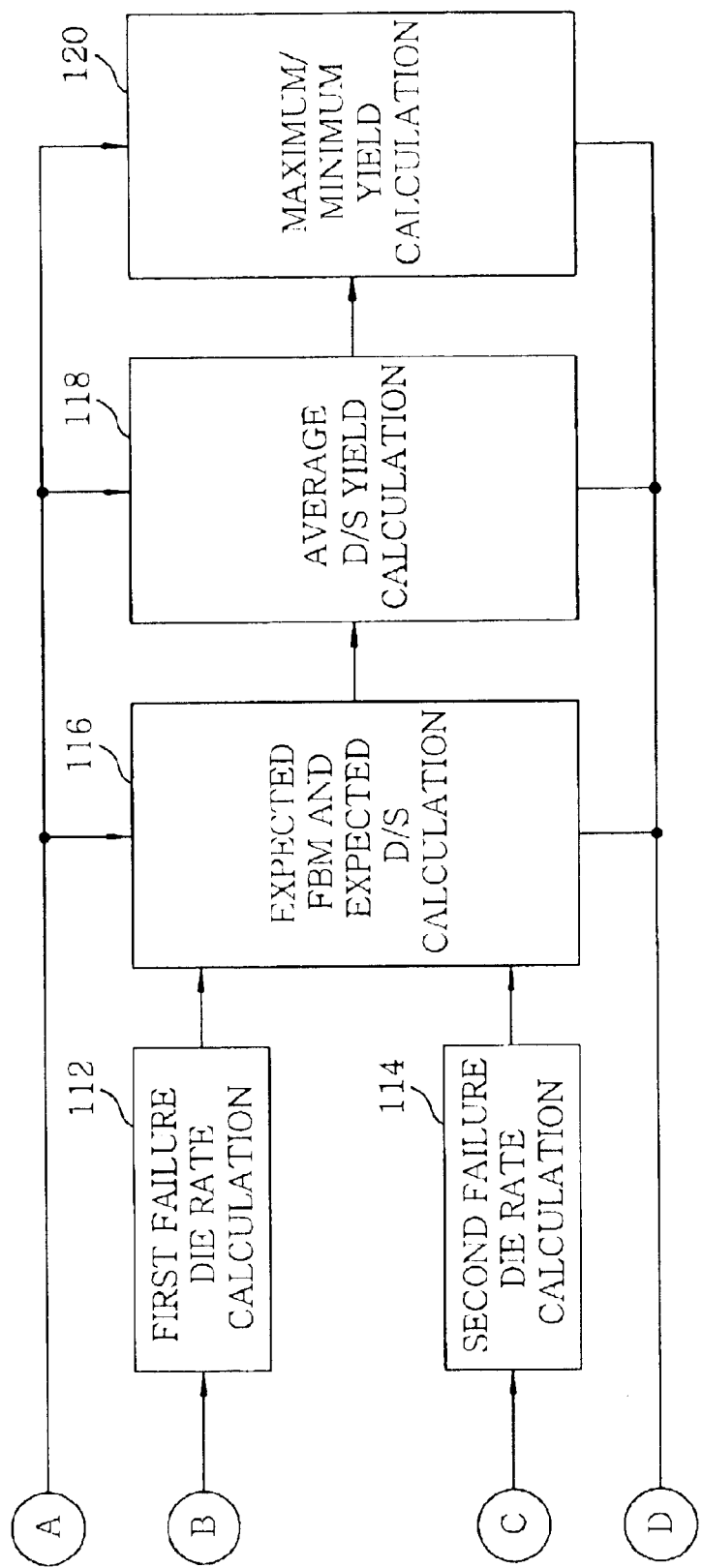
Figure 6A:
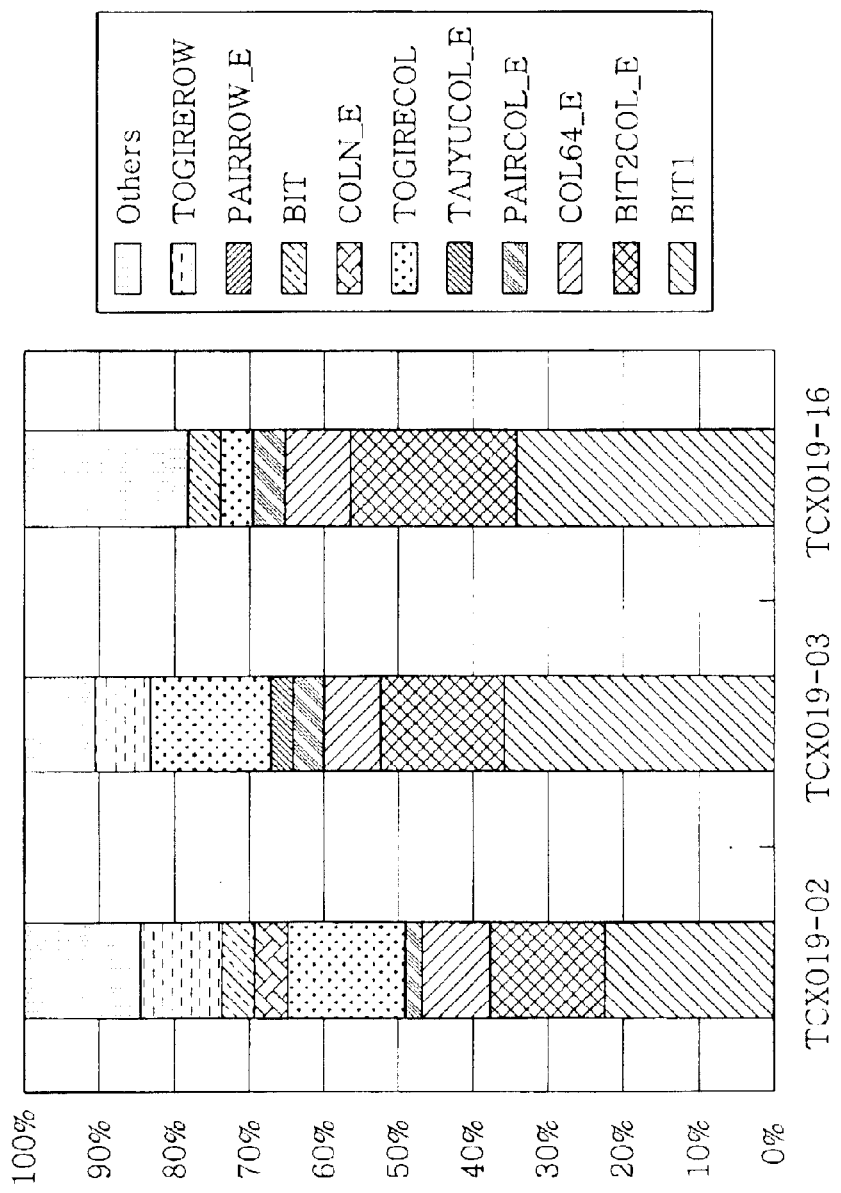
FIG. 6A represents a graph for showing a failure generation rate on a failure bit mode basis of each wafer in case the failure analysis is performed in accordance with the conventional method.
Figure 6B:
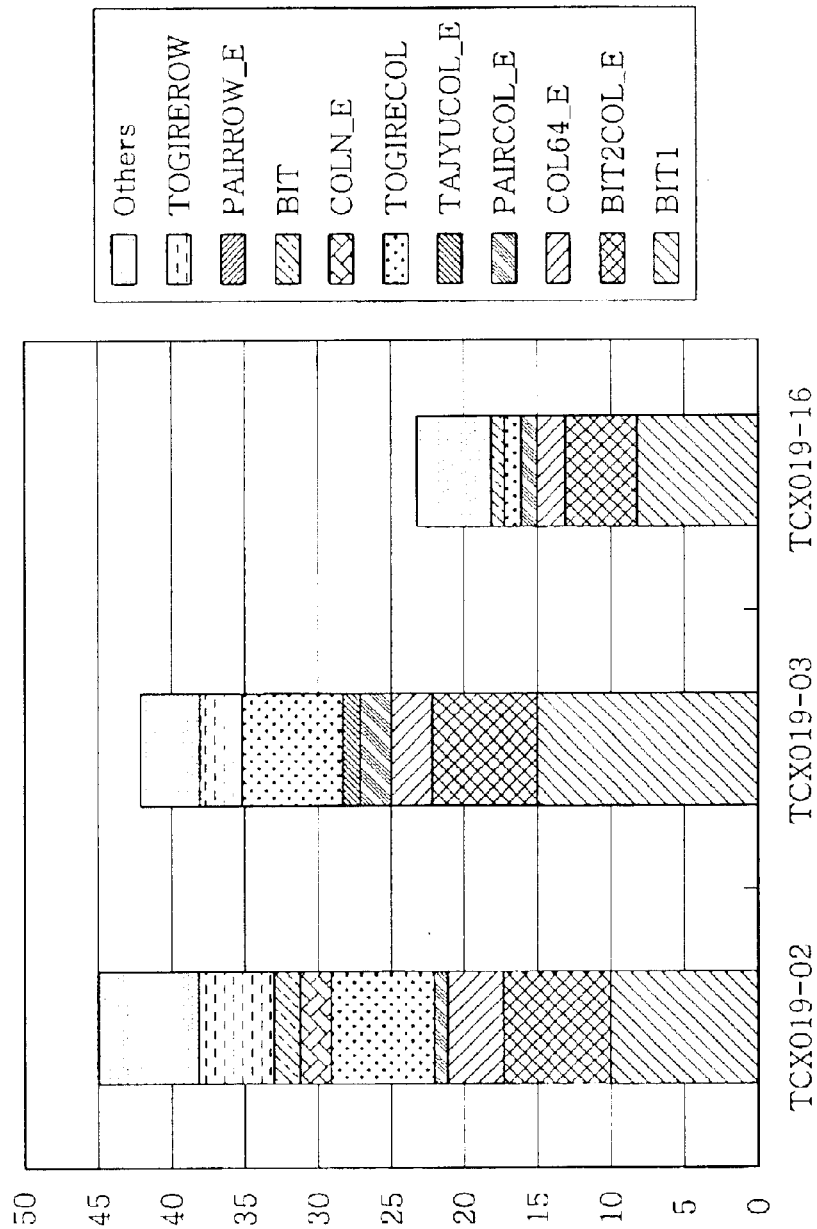
FIG. 6B offers a graph for illustrating a failure bit mode number of each wafer when the failure analysis is performed in accordance with the conventional method.

FIG. 1 shows a block diagram of an apparatus for analyzing a failure of a semiconductor device in accordance with a preferred embodiment of the present invention. The failure analysis apparatus includes a wafer map memory 102, a failure die/rate calculation block 104, a D/S and FBM calculation block 106, a control block 108, a memory block 110, a first failure die rate calculation block 112, a second failure die rate calculation block 114, an expected FBM and expected D/S calculation block 116, an average D/S yield calculation block 118, a maximum/minimum yield calculation block 120 and a monitor 122.

Referring to FIG. 1, there is illustrated the wafer map memory 102 for storing test result data provided from a test equipment (not shown). Specifically, the data includes die level FBM diffusion information and wafer map information on a failure die and a failure die bit of each test wafer. The test result data stored therein is retrieved by a reading control instruction of the control block 108 and transmitted to the failure die/rate calculation block 104 and the D/S and FBM calculation block 106.

The failure die/rate calculation block 104 calculates a failure die/rate on a test mode (i.e., O/S, Func, DC, IDD and the like) of each wafer and transmits the calculated failure die/rate to the control block 108. The D/S and FBM calculation block 106 calculates a D/S good die number/yield (YLD) and a FBM good die number/yield (YLD), respectively, on the test mode of each wafer and transmits the calculated values to the control block 108.

By using the failure die/rate, the D/S good die number/yield, and the FBM good die number/yield on the test mode of each wafer, the control block 108 calculate a failure die number/average rate on the test mode of total wafers, a total D/S good die number/average yield, and a total FBM good die number/its average yield. As can be seen from FIG. 3, the calculation results are stored in the memory block 110 as a table. The result values in the table are retrieved in response to a request (a user selection signal) of a user (or an operator) and displayed on the monitor 122.

Thereafter, in case the user selects and defines one failure bit mode among a plurality of failure bit modes (i.e., TOGIREPOW, PAIPROW_E, BIT, COLN_E, BIT2COL_E, BIT1, and the like), it is possible to request a calculation of expected result values, i.e., an expected FBM yield, an expected D/S yield, an average D/S yield, and a maximum/minimum yield. If the user requests the calculation thereof, the control block 108 retrieves from the memory block 110 information on a total die number, a total failure die number and a failure die number of a target failure bit mode and counts the values. Then, the counted value A① and the above-mentioned expected result values are transmitted to the first and the second failure die rate calculation block 112 and 114.

Based on the information provided from the control block 108 on the total die number and the failure die number of the target failure bit mode, the first failure die rate calculation block 112 calculates a failure die rate B① for total dies, as will be shown in a following Eq. (1), and the second failure die rate calculation block 114 calculates a failure dire rate C① for total failure dies, as will be seen in a following Eq. (2). Such information on the failure die rate for the total dies and the failure die rate for the total failure dies are provided to the expected FBM and expected D/S calculation block 116.

$$B①=x/TD \qquad \text{Eq.(1)}$$

$$C①=x/FD \qquad \text{Eq.(2)}$$

Herein, x, TD and FD indicate the failure die number of the selected failure bit mode, the total die number and the total failure die number, respectively.

Meanwhile, the expected FBM and expected D/S calculation block 116 adds the FBM yield provided from the control block 108 to the failure die rate for the total dies provided from the first failure die rate calculation block 112 to thereby calculate an expected FBM yield D①. The expected FBM yield D①, the FBM yield and the D/S yield are used for calculating an expected D/S yield E①, as will be shown in a following Eq. (3).

$$E①=C①-Xy$$

$$Xy=\Sigma(FY-DY)/n \qquad \text{Eq. (b 3)}$$

Herein, FY, DY, and n represent the FBM yield, the D/S yield and the total number of selected wafers, respectively.

The average D/S yield calculation block 118 calculates an average D/S yield Yu1 and Yu2 of the selected failure bit mode by using a following Eq. (4).

$$Yu1 = \mathrm{avg}(D\textcircled{1}) - Xy$$

$$Yu2 = \mathrm{avg}(D\textcircled{2}) - Xy \qquad \text{Eq.(4)}$$

Herein, Yu1 and Yu2 represent the average D/S yield obtained by defining the selected failure bit mode and the average D/S yield obtained by defining the selected failure bit mode in consideration of dies overlapped with another failure bit mode, respectively.

The maximum/minimum yield calculation block 120 calculates a maximum and a minimum yield $EY_B$ and $EY_W$, respectively, by using a following Eq. (5), and transmits the calculation results to the control block 108.

$$EY_B = \mathrm{avg}(D\textcircled{1}) - \min(FY - DY)$$

$$EY_W = \mathrm{avg}(D\textcircled{2}) - \max(FY - DY) \qquad \text{Eq. (5)}$$

Herein, min(FY−DY) and max(FY−DY) indicate a minimum and a maximum deviation value between FY and DY, respectively.

Consequently, as illustrated in FIG. 4, result values obtained by defining a specific failure bit mode are displayed on the monitor 122 according to the control of the control block 108.

In other words, FIG. 4 provides a simulation result obtained in case BIT2COL_E is selected as a failure bit mode to be defined. Referring to the table shown in FIG. 4, there are illustrated Only Select Fail Class (X1), Select Fail Class & other (X2) and Not Select Fail Class (X3) indicating result values obtained by defining the selected failure bit mode, result values obtained by defining the selected failure bit mode in consideration of dies overlapped with another failure bit mode, and result values obtained by defining the selected failure bit mode in consideration of dies overlapped with another failure bit mode except the selected failure bit mode, respectively.

Based on the result values displayed on the monitor, a user can easily discover a main issue of the failure. Specifically, in case X1 is selected, if an average expected D/S yield of X2 or X3 is higher than that of X1, it is not preferable. Thus, each failure bit mode is selected as a failure bit mode to be defined, and result values obtained therefrom are used for simply and easily discovering the main issue of the failure. Accordingly, it is possible to achieve a goal of the production yield and to strengthen the competitiveness in a prime cost of a semiconductor device.

Hereinafter, a process for analyzing a failure of a semiconductor device by using the above-mentioned failure analysis apparatus in accordance with the present invention will be described.

FIG. 2 presents a flowchart for describing a process for performing an analysis of the failure of the semiconductor device in accordance with the present invention.

When a test mode is operated on test devices (or test wafers) in order to analyze the failure of the semiconductor device in accordance with the present, test result data including die level FBM diffusion information and wafer map information on a failure die and a failure bit of each test wafer is stored in the wafer map memory 102 (step 202).

Next, a failure die number/rate on a test mode, e.g., O/S, Func, DC and IDD, of each wafer is calculated (step 204).

Then, a FBM good die number/yield and a D/S good die number/yield of each test wafer are calculated, respectively (step 206).

The failure die number/rate, the FBM good die number/yield and the D/S good die number/yield are used for calculating a failure die number/average rate, a total D/S good die number/average yield, and a total FBM good die number/average yield of each test mode for total wafers. Then, as illustrated in FIG. 3, the calculated values are stored in the memory block 110 as a table.

The control block 108 waits for a user to select a failure bit mode to be defined (step 208). If the user selects one failure bit mode from a plurality of failure bit modes (e.g., TOGIREROW, PAIPROW_E, BIT, CONL_E, BIT2CON_E, BIT1 and the like) as a target failure bit mode to be defined, a total die number, a total failure die number, and a failure die number of the selected target failure bit mode of each test wafer are counted (step 210).

As shown in the aforementioned Eq. (1), the total die number is divided by the failure die number of the selected failure bit mode, so that a failure die rate of the failure bit mode for total dies can be calculated (step 212). Further, as can be seen from the above-mentioned Eq. (2), the total failure die number is divided by the failure die number of the selected failure bit mode, so that a failure die rate of the failure bit mode for total failure dies can be calculated (step 214).

Thereafter, the failure die rate value for the total dies is added to the FBM yield value to thereby calculate an expected FBM yield (step 216). Further, the expected FBM yield, the FBM yield, and the D/S yield of each test wafer are used for calculating an expected D/S yield, as can be seen from the above-described Eq. (3) (step 218).

As described in the aforementioned Eq. (4), an average D/S yield of the selected failure bit mode is calculated based on the expected FBM yield, the FBM yield, the D/S yield of each test wafer (step 220). As can be seen from FIG. 4, the calculated average D/S yield includes an average D/S yield obtained by defining the selected failure bit mode, an average D/S yield obtained by defining the selected failure bit mode in consideration of dies overlapped with another failure bit mode, and an average D/S yield obtained by defining the selected failure bit mode in consideration of dies overlapped with another failure bit mode except the selected failure bit mode.

The expected FBM yield, a maximum and a minimum deviation value between the FBM yield and the D/S yield are used for calculating a maximum and a minimum yield obtained by defining a specific failure bit mode, as illustrated in the above-described Eq. (5) (step 222).

Then, result values obtained by defining the specific failure bit mode are displayed on the monitor 122 (step 224).

As shown in FIG. 4 illustrating a simulation result obtained by selecting BIT2COL_E as a target failure bit mode to be defined, the result values obtained by defining the specific failure bit mode, i.e., the expected FBM yield, the expected D/S yield, the average D/S yield, the maximum yield and the minimum yield, are displayed on the monitor 122.

Whenever the user selects a failure bit mode to be defined, the steps 210 to 224 are iteratively performed to thereby display a failure analysis result of a semiconductor device on the monitor 122.

Based on the result values displayed on the monitor 122, the user can simply and easily discover a main issue of the failure. In other words, in case the user selects X1, if an average D/S yield of X2 or X3 is higher than that of X1, it is not preferable. Therefore, each failure bit mode is selected as a failure bit mode to be defined, and result values obtained therefrom are used for simply and easily discovering the main issue of the failure.

Consequently, the present invention can achieve a goal of a production yield of a semiconductor device and to strengthen the competitiveness in a prime cost of the semiconductor device by using the above-mentioned failure analysis method.

In a conventional method, an overlap relation on a failure bit mode basis is checked by an observation using a masking, and a main bit failure is experientially discovered based on the observation result. In the present invention, however, a certain failure bit mode is selected from a plurality of failure bit modes as a target failure bit mode to be defined. Then, an expected FBM yield, an expected D/S yield, an average D/S yield and a maximum/minimum yield are automatically calculated, so that the main failure factor can be simply and easily discovered from various types of the failure bit modes, wherein the expected FBM yield and the expected D/S yield are calculated based on a failure die rate of the selected failure bit mode for total dies and a failure die rate of the selected failure bit mode for total failure dies. Therefore, it is possible to achieve a goal of a production yield of a semiconductor device and to strengthen the competitiveness in a prime cost of the semiconductor device.

While the invention has been shown and described with respect to the preferred embodiments, it will be understood by those skilled in the art that various changes and modifications may be made without departing from the spirit and scope of the invention as defined in the following claims.

What is claimed is:

1. An apparatus for analyzing a failure of a semiconductor device, which calculates a failure die number/rate, a failure bit map (FBM) yield and a die/sorting (D/S) yield on a test mode of each test wafer, the apparatus comprising:

a wafer map memory for storing test result data of said each test wafer;

a means for calculating a failure die number/rate, a D/S good die number/yield and a FBM good die number/yield on the test mode of said each test wafer;

a means for storing the calculated values;

a means for calculating, in case a failure bit mode to be defined is selected from a plurality of failure bit modes, a failure die rate for total dies and a failure die rate for total failure dies based on a total die number and a failure die number of the selected failure bit mode;

a means for calculating an expected FBM yield based on the FBM yield and the failure die rate for the total dies and calculating an expected D/S yield based on the expected FBM yield, the FBM yield and the D/S yield;

a means for calculating an average D/S yield of the selected failure bit mode based on the expected FBM yield, the FBM yield and the D/S yield of the selected test wafer;

a means for calculating a maximum/minimum yield based on the expected FBM yield, and a minimum and a maximum deviation value between the FBM yield and the D/S yield; and a means for displaying the calculated values on a monitor.

2. The apparatus of claim 1, wherein the calculated average D/S yield includes an average D/S yield obtained by defining the selected failure bit mode, an average D/S yield obtained by defining the selected failure bit mode in consideration of dies overlapped with another failure bit mode, and an average D/S yield obtained by defining the selected bit mode in consideration of dies overlapped with another failure bit mode except the selected failure bit mode.

3. A method for analyzing a failure of a semiconductor device, which calculates a failure die number/rate, a failure bit map (FBM) yield and a die/sorting (D/S) yield on a test mode of each test wafer, the method comprising the steps of:

(a) calculating a failure die number/rate, a D/S good die number/yield and a FBM good die number/yield on the test mode of said each test wafer;

(b) waiting for a user to select a failure bit mode to be defined from a plurality of failure bit modes;

(c) selecting a certain failure bit mode as a failure bit mode to be defined, and calculating a failure die rate for total dies and a failure die rate for total failure dies based on a total die number and a failure die number of the selected failure bit mode;

(d) calculating an expected FBM yield based on the FBM yield and the failure die rate for the total dies;

(e) calculating an expected D/S yield based on the expected FBM yield, the FBM yield and the D/S yield;

(f) calculating an average D/S yield of the selected failure bit mode based on the expected FBM yield, the FBM yield, and the D/S yield of the selected test wafer;

(g) calculating a maximum and a minimum yield based on the expected FBM yield, and a maximum and a minimum deviation value between the FBM yield and the D/S yield;

(h) displaying the calculated values on a monitor; and (i) iteratively performing the steps (c) to (h) whenever a new failure bit mode is selected as a failure bit mode to be defined.

4. The apparatus of claim 1, wherein the calculated average D/S yield includes an average D/S yield obtained by defining the selected failure bit mode, an average D/S yield obtained by defining the selected failure bit mode in consideration of dies overlapped with another failure bit mode, and an average D/S yield obtained by defining the selected failure bit mode in consideration of dies overlapped with another failure bit mode except the selected failure bit mode.

* * * * *